US010381562B1

(12) United States Patent
Rosales et al.

(10) Patent No.: US 10,381,562 B1
(45) Date of Patent: Aug. 13, 2019

(54) METHOD AND APPARATUS FOR COOLING OF AN ELECTRONIC DEVICE

(71) Applicant: QUALCOMM Incorporated, San Diego, CA (US)

(72) Inventors: Jorge Luis Rosales, San Diego, CA (US); Victor Chiriac, Phoenix, AZ (US); Sean Charles Andrews, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/981,931

(22) Filed: May 17, 2018

(51) Int. Cl.
*H01L 45/00* (2006.01)

(52) U.S. Cl.
CPC ...... *H01L 45/1286* (2013.01); *H01L 45/1293* (2013.01)

(58) Field of Classification Search
CPC .................................................. H01L 45/1286
See application file for complete search history.

(56) References Cited

U.S. PATENT DOCUMENTS

2005/0207120 A1* 9/2005 Tseng .................... H01L 23/427
361/700

* cited by examiner

*Primary Examiner* — William A Harriston
(74) *Attorney, Agent, or Firm* — Qualcomm Incorporated

(57) ABSTRACT

Some features pertain to an apparatus that includes a first heat spreader and a second heat spreader, a matrixed heat spreader, the matrixed heat spreader including a first plurality of portions perpendicular to a second plurality of portions, the first plurality of portions intersects the second plurality of portions, and a phase change material (PCM) located in a plurality of reservoirs defined by the matrixed heat spreader.

22 Claims, 10 Drawing Sheets

METHOD AND APPARATUS FOR COOLING OF AN ELECTRONIC DEVICE

BACKGROUND

Field of the Disclosure

Various features relate to a method and apparatus for cooling an electronic device including phase change material and a matrixed heat spreader.

Background

Integrated circuits (ICs), substrates, packages and electronic devices are being continually driven to smaller form factors. As the area of the ICs grow smaller, the power consumption, and thus the power density across the IC increases. Increased power density across the IC corresponds to an increase in the amount of heat produced by the IC. Increased heat may degrade the performance of active devices such as transistors on the IC. Moreover, increased IC temperatures may be problematic from a consumer use standpoint. For example, handheld consumer devices such as mobile phones, laptops, tablet computers, etc., cannot exceed specific temperatures along surfaces that may be touched by a user, to safe guard the user from burns or discomfort.

Cooling one or more IC's within the device helps reduce the surface temperature of the device and increases the lifespan of the ICs. ICs may be cooled using either passive or active means.

FIG. 1 illustrates a cross-section view of a conventional apparatus for cooling. Specifically, FIG. 1 illustrates an apparatus 100 including a first heat spreader 102a, a second heat spreader 102b, and a phase change material (PCM) 104 located between the first heat spreader 102a and the second heat spreader 102b. The PCM 104 is a material that stores and releases energy (e.g., heat) at certain temperatures.

The apparatus 100 is coupled to a heat source 199. For example, the first heat spreader 102a may be coupled to the heat source 199, and the second heat spreader 102b may be facing away from the heat source 199. As the heat source 199 rises in temperature, heat dissipates from the heat source 199 to the first heat spreader 102a, and to the PCM 104. The PCM 104 begins as a solid material, absorbing heat transferred from the heat source 199 and spread by the heat spreader 102a to the PCM 104. When the PCM reaches the temperature at which its phase change occurs, it changes to a liquid material. As the PCM 104 heats up (i.e., changing from solid to liquid form), it absorbs a large of amount of energy and therefore aids in reducing the heat source temperature. Once the power/temperature drops and the PCM 104 transitions back to a solid, it releases the latent energy to the second heat spreader 102b which allows the heat to be dissipated away from the apparatus 100 and away from the heat source 199. Both the heat source 199 and the apparatus 100 may be incorporated into an electronic device (not shown).

One drawback of the apparatus 100 is that it may not dissipate heat effectively since the transfer of heat from the heat source 199 to the PCM 104 is limited by the first heat spreader 102a and by the ability of the PCM 104 to effectively absorb energy throughout the material. In other words, the first heat spreader 102a only provides limited surface area with which to spread the heat to the PCM 104. Moreover, the apparatus 100 is reliant upon the PCM 104 to transfer heat from the heat source 199 to the second heat spreader 102b. Accordingly, the effective cooling of the heat source 199 is slow and inefficient. A need exists to more quickly transfer heat from the heat source 199 into the PCM 104 for latent heat activation and through it for steady state conditions and spreading.

FIG. 2A illustrates a cross-section view of another conventional apparatus for cooling. Specifically, FIG. 2A illustrates an apparatus 200 including a first heat spreader 202a, a second heat spreader 202b, and a plurality of carbon nanotubes (CNT) 206 located between a PCM 204. The apparatus 200 may be coupled to a heat source such as a heat source 199 (see FIG. 1).

FIG. 2B illustrates a top view of the apparatus 200 of FIG. 2A. In this view, it can be seen the plurality of CNT 206 are located across the area of the PCM 204.

Although the plurality of CNT 206 offers increased heat spreading surface area, each one of the plurality of CNT 206 is small and only provide limited surface area with which to spread the heat to the PCM 104. Accordingly, there is need in the industry for a mechanism which can dissipate heat more quickly and efficiently.

SUMMARY

Various features relate to a method and apparatus for cooling an electronic device including phase change material and a matrixed heat spreader.

A first example provides an apparatus that includes a first heat spreader, a second heat spreader, and a matrixed heat spreader. The matrixed spreader includes a first plurality of portions perpendicular to a second plurality of portions, where the first plurality of portions intersects the second plurality of portions, and a phase change material (PCM) located in a plurality of reservoirs defined by the matrixed heat spreader.

A second example provides a method of fabricating an apparatus for cooling an electronic device, the method including forming a first heat spreader and a second heat spreader, forming a first plurality of portions and a second plurality of portions of a matrixed heat spreader, the first plurality of portions perpendicular to, and intersecting the second plurality of portions, and depositing a phase change material (PCM) to surround the matrixed heat spreader, the PCM located in a plurality of reservoirs defined by the matrixed heat spreader.

DRAWINGS

Various features, nature and advantages may become apparent from the detailed description set forth below when taken in conjunction with the drawings in which like reference characters identify correspondingly throughout.

FIG. 7A-E illustrates the manufacture of an apparatus for cooling an electronic device.

FIG. 8A-E illustrates the manufacture of another apparatus for cooling an electronic device.

FIG. 9A-E illustrates the manufacture of another apparatus for cooling an electronic device.

Figure 10:
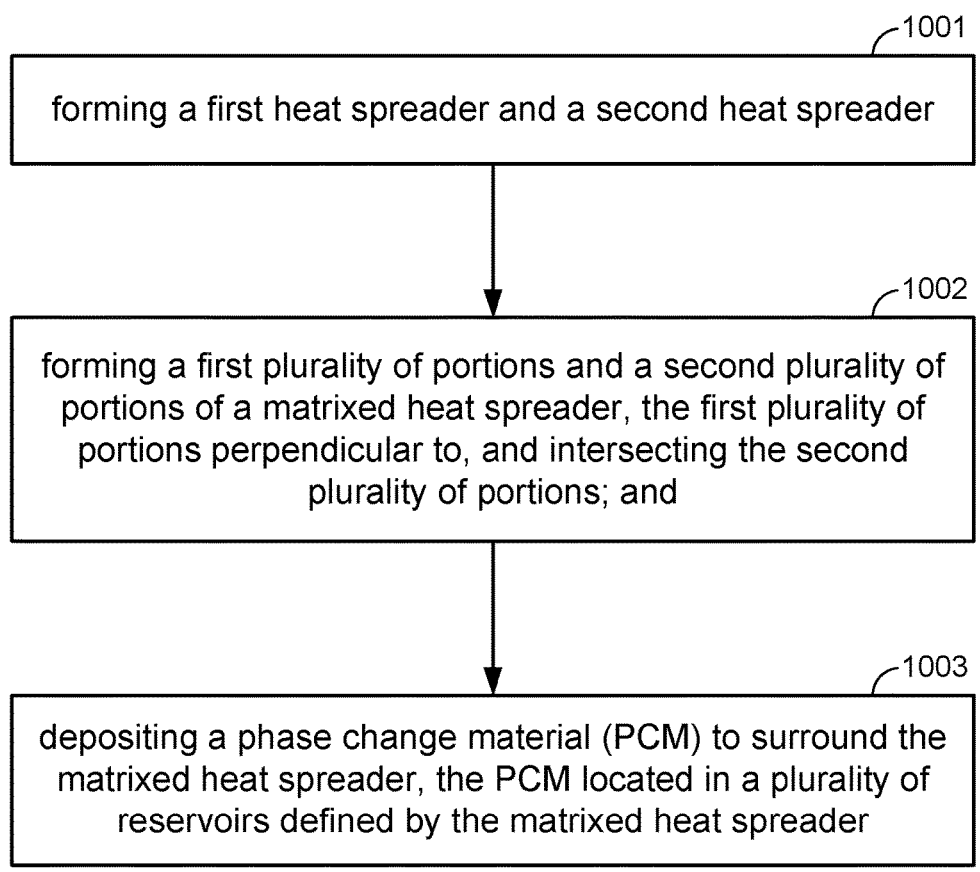

FIG. 10 illustrates an exemplary flow diagram of a method for manufacturing an apparatus for cooling.

Figure 11:
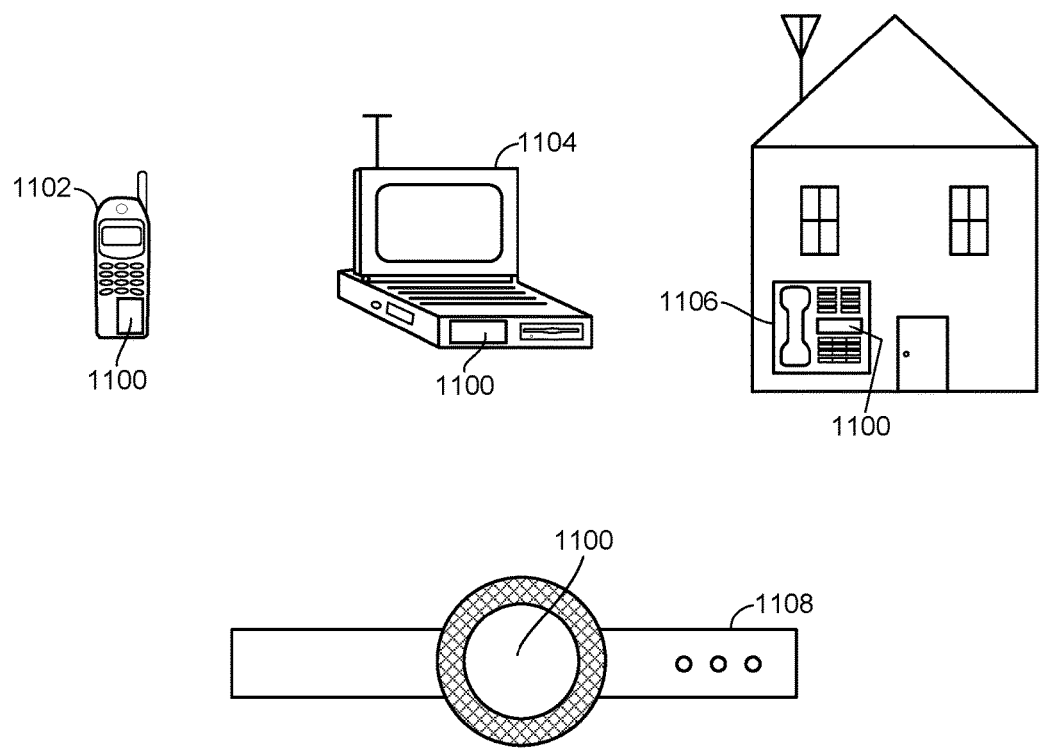

FIG. 11 illustrates various electronic devices that may include the various integrated devices, semiconductor devices, dies, integrated circuits, and/or packages described herein.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features relate to a method and apparatus for cooling an electronic device including phase change material and a matrixed heat spreader. The apparatus is configured to be coupled to a heat source including an integrated circuit, a package, a circuit or a heat region. The heat source may be located or integrated in an electronic device such as a cell phone, a tablet, a laptop, etc.

In a first aspect, the apparatus includes a first heat spreader, a second heat spreader, and a matrixed heat spreader. The matrixed heat spreader includes a first plurality of portions perpendicular to a second plurality of portions. The first plurality of portions intersects the second plurality of portions. A phase change material (PCM) is located in a plurality of reservoirs defined by the matrixed heat spreader. The apparatus dissipates heat from the heat source to the first heat spreader, to the PCM, and then out to the second heat spreader.

As the PCM heats up (i.e., as heat dissipates from the heat source to the PCM), the PCM changes from solid to liquid. The PCM stores heat and slows down the heat dissipation through the second heat spreader. The second heat spreader may be coupled to a back cover of the device and therefore the PCM avoids discomfort to an end user from the back cover of the device heating up too quickly. As the device cools down, the PCM changes back to solid form. Third matrixed heat spreader allows for heat to be spread quickly from the first heat spreader to the PCM.

In a second aspect, the apparatus includes the features of the first aspect, along with a third heat spreader. The third heat spreader includes a third plurality of portions and a fourth plurality of portions, formed in an alternating pattern on the second and first heat spreader, respectively. Together the third heat spreader and the matrixed heat spreader form a serpentine shape that provides increased surface area for the heat to dissipate from the first heat spreader to the PCM, and then eventually out through the second heat spreader.

In a third aspect, the apparatus includes the features of the second aspect, along with a fourth heat spreader. The fourth heat spreader includes a fifth plurality of portions located between the first heat spreader and the second heat spreader, so the fifth plurality of portions intersects the PCM, splitting the PCM into two parts. The fourth heat spreader provides increased surface area for the heat to dissipate from the first heat spreader to the PCM, and then eventually out through the second heat spreader.

Figure 3:
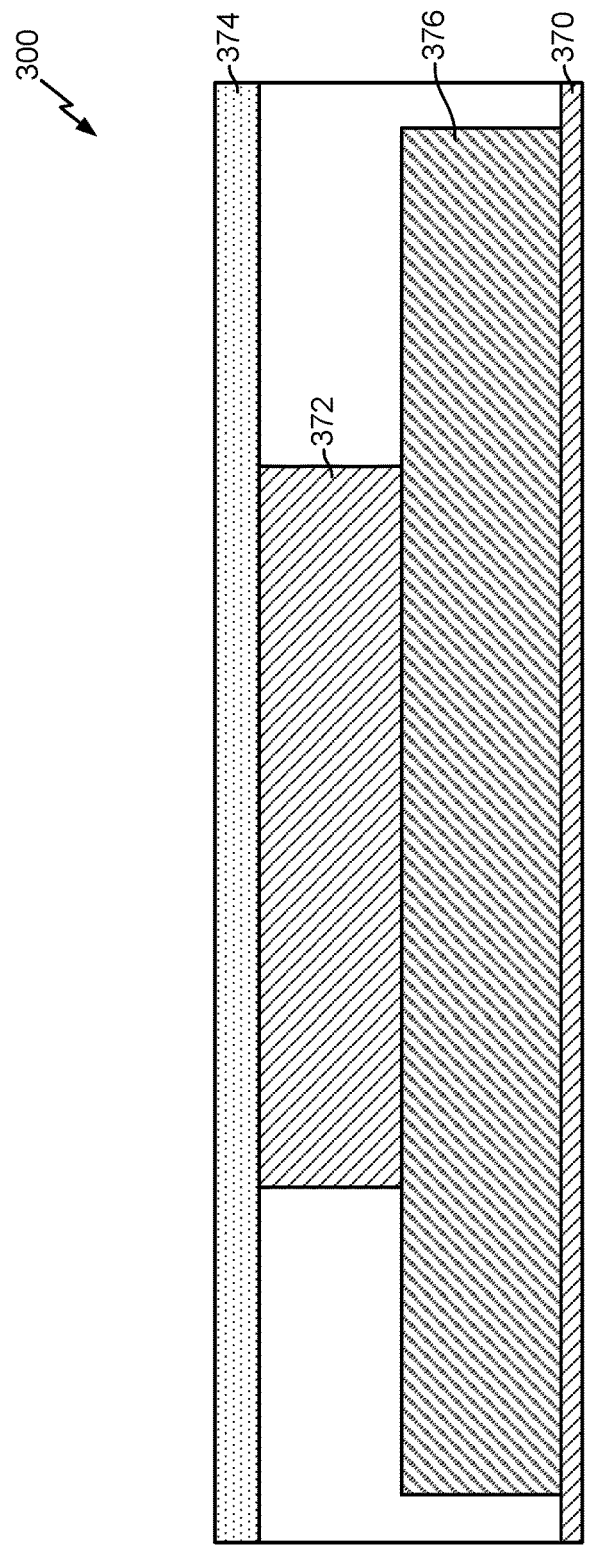
FIG. 3 illustrates a cross-section view of an electronic device that includes an exemplary apparatus for cooling the electronic device.

An Electronic Device Including an Exemplary Apparatus for Cooling the Electronic Device FIG. 3 illustrates a cross-section view of an electronic device that includes an exemplary apparatus for cooling the electronic device. Specifically, FIG. 3 illustrates the electronic device 300 including a back cover 370, an exemplary apparatus 376, a heat source 372, and a top of the electronic device 374. The heat source 372 may be an integrated circuit, a circuit, a package, a semiconductor, a heat region or any other electronic device that generates heat. The top 374 of the electronic device 300 may be a display screen, an LCD, or a top surface, such as a cover, of the electronic device 300. The exemplary apparatus 376 may be the same or similar to the apparatus 400, 500, or 600 as will be described later with respect to FIG. 4, FIG. 5 and/or FIG. 6.

The exemplary apparatus 376 is located under the heat source 372 so that the exemplary apparatus 376 may cool the heat source 372, as well as store some of the heat generated by the heat source 372. By storing at least some of the heat generated by the heat source 372, the exemplary apparatus 376 serves to protect against the back cover 370 from reaching temperatures which may be uncomfortable to an end user. The exemplary apparatus 376 is located over or above the back cover 370 so that the exemplary apparatus 376 may later dissipate heat through the back cover 370.

Figure 4A:
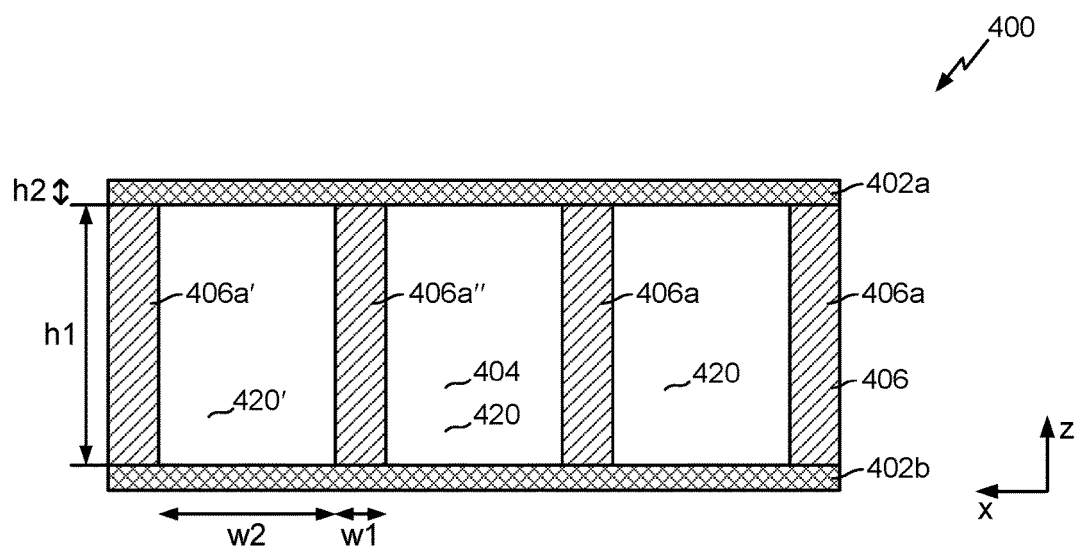
FIG. 4A illustrates a cross-section view of an apparatus for cooling an electronic device.

Exemplary Apparatus for Cooling an Electronic Device, Including a Phase Change Material and a Matrixed Heat Spreader FIG. 4A illustrates a cross-section view of an apparatus 400 for cooling an electronic device. FIG. 4A is shown on the X-Z axis and is a cross section of FIG. 4B taken at A'. Specifically, FIG. 4A illustrates the apparatus 400, including a first heat spreader 402a, a second heat spreader 402b, a matrixed heat spreader 406, and a phase change material (PCM) 404. The matrixed heat spreader 406 includes a first plurality of portions 406a and a second plurality of portions 406b (discussed in FIG. 4B). The apparatus 400 is configured to be coupled to a heat source such as the heat source 372 of FIG. 3. The apparatus 400 may be incorporated into an electronic device such as the exemplary electronic device 300 of FIG. 3.

The matrixed heat spreader 406 is coupled, either directly or indirectly, and thermally coupled, to an inner side of the first heat spreader 402a and to an inner side of the second heat spreader 402b. The inner side of the first heat spreader 402a may be defined as the side of the first heat spreader 402a that faces the second heat spreader 402b, and the inner side of the second heat spreader 402b may be defined as the side of the second heat spreader 402b that faces the first heat spreader 402a. In one aspect, the PCM 404 is thermally coupled to the first heat spreader 402a (e.g., the inner side), to the second heat spreader 402b (e.g., the inner side), and to the matrixed heat spreader 406. In another aspect, the PCM 404 is thermally coupled to the first heat spreader 402a (e.g., the inner side) or to the second heat spreader 402b (e.g., the inner side), and to the matrixed heat spreader 406.

The first plurality of portions 406a and the second plurality of portions 406b are perpendicular to each other, and vertical relative to the first heat spreader 402a and the second heat spreader 402b.

Figure 4B:
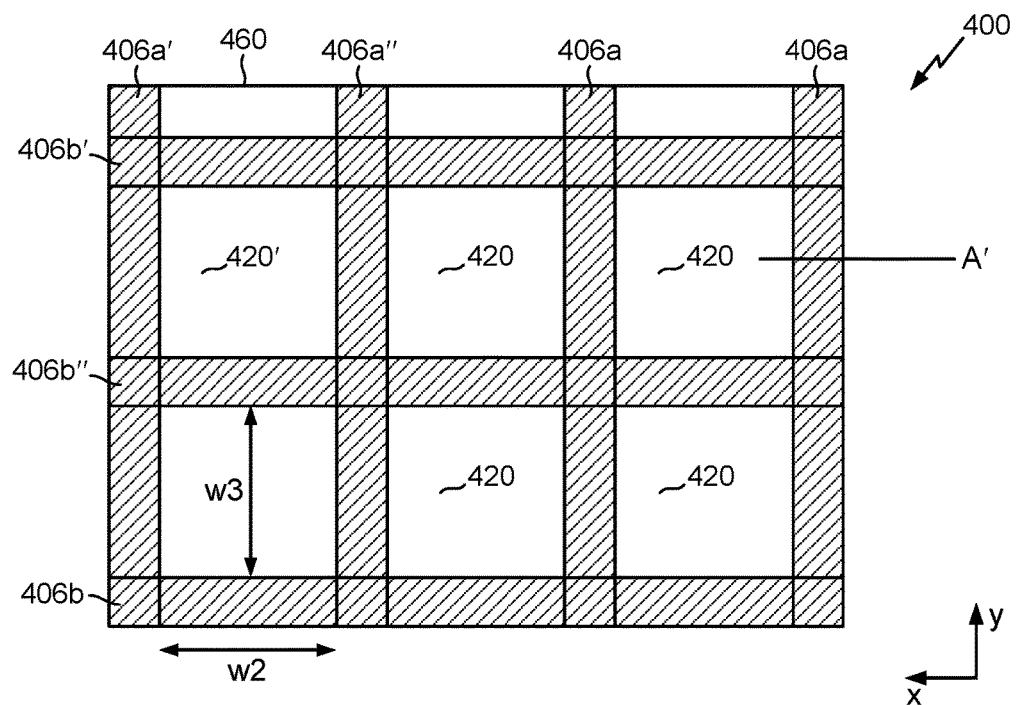
FIG. 4B illustrates a top-view of the apparatus of FIG. 4A.

FIG. 4B illustrates a top-view of the apparatus 400. FIG. 4B is shown on the X-Y axis, and for simplicity, does not show the first heat spreader 402a, the second heat spreader 402b, or the PCM 404. Specifically, FIG. 4B illustrates the matrixed heat spreader 406, including the first plurality of portions 406a, and the second plurality of portions 406b. The first plurality of portions 406a are perpendicular to the second plurality of portions 406b. The first plurality of portions 406a intersects the second plurality of portions 406b, so that together, they form a matrixed configuration (i.e., a matrixed heat spreader 406).

The width w1 of the first plurality of portions 406a may be in the range of approximately 25-200 microns. The width of the second plurality of portions 406b may be about the same as, or different from the width w1 of the first plurality of portions 406a. The width w2 between a first one of the first plurality of portions 406a and a second one of the first plurality of portions 406a may be in the range of approximately 0.25-2 mm. The width w3 between a first one of the second plurality of portions 406b and a second one of the second plurality of portions 406b may be in the range of approximately 0.25-2 mm. The height h1 of the first plurality of portions 406a and the second plurality of portions 406b may be in the range of approximately 0.25-1 mm. The height h2 of the first heat spreader 402a or the second heat spreader 402b may be in the range of approximately 0.25-1 mm.

The apparatus 400 includes a plurality of reservoirs 420 shown in both FIGS. 4A and 4B. The PCM 404 is located in the plurality of reservoirs 420. In one aspect, the PCM 404 substantially fills each one of the plurality of reservoirs 420. In another aspect, the PCM 404 only partially fills each one of the plurality of reservoirs 420.

FIG. 4A illustrates a cross-section view of the plurality of reservoirs 420 including a first reservoir 420'. The plurality of reservoirs 420 are defined by the matrixed heat spreader 406. The first heat spreader 402a is over the matrixed heat spreader 406, and the second heat spreader 402b is under the matrixed heat spreader 406. The first heat spreader 402a, the second heat spreader 402b, and the matrixed heat spreader 406 enclose the PCM 404. In an aspect, either the top 374 or the back cover 370 of the exemplary device 300 illustrated in FIG. 3 may enclose at least a portion of the PCM 404.

FIG. 4B illustrates a top view of the plurality of reservoirs 420. In this view, it can be seen that the first reservoir 420' of the plurality of reservoirs 420 is defined by a first one of a first plurality of portions 406a' and a second one of a first plurality of portions 406a'' in parallel with each other, and a first one of a second plurality of portions 406b' and a second one of a second plurality of portions 406b'' in parallel with each other, and perpendicular to, and intersecting the first one of the first plurality of portions 406a' and the second one of a first plurality of portions 406a'', respectively. Finally, the first heat spreader 402a is located over matrixed heat spreader 406, including over the plurality of first portions 406a and the plurality of second portions 406b, and the second heat spreader 402b is located under the matrixed heat spreader 406, including under the plurality of first portions 406a and the plurality of second portions 406b. In this aspect, the first heat spreader 402a, the second heat spreader 402b, and the matrixed heat spreader 406, enclose the PCM 404.

In another aspect, a second reservoir 420'' (shown in FIG. 4B) of a plurality of reservoirs 420 may be defined by the first one of the first plurality of portions 406a', and the second one of the first plurality of portions 406a'' in parallel with each other, and a first one of a second plurality of portions 406b' and a wall 460 in parallel with each other, and perpendicular to, and intersecting the first one of the first plurality of portions 406a' and the second one of a first plurality of portions 406a'', respectively. The wall 460 may be part of the electronic device 300 of FIG. 3, such as a sidewall of the electronic device 300.

The PCM 404 is directly or indirectly coupled, and thermally coupled to the first plurality of portions 406a and the second plurality of portions 406b. In other words, the PCM 404 is located on a sidewall of the first plurality of portions 406a and the second plurality of portions 406b, wherein the sidewalls are inside of the apparatus 400.

In general, the PCM 404 is a material that temporarily stores heat that is dissipated from a heat source or heat region (e.g., heat source 372 of FIG. 3) and delays the release of the heat to the surface of the device (e.g., back cover 370). The PCM 404 helps cool the heat source or heat region 372 while also helping prevent an external surface of an electronic device (e.g., 300 of FIG. 3) from reaching a temperature that is uncomfortable or harmful to a user. As the heat source 372 generates heat, heat energy is absorbed by the PCM 404 and stored as latent heat. In one aspect, the PCM 404 changes from a solid state to a liquid state once it reaches its melting point and as it absorbs heat energy. By absorbing heat energy, the PCM 404 aids in cooling the heat source 372. As the heat source or heat region 372 cools down, the PCM 404 releases the latent heat, solidifying in the process. In other words, heat is absorbed when the PCM 404 changes from solid to liquid, and heat is released when the PCM changes from liquid to solid.

More specifically, when the electronic device (e.g., 300 of FIG. 3) is powered ON or during times of high usage of the electronic device 300 (e.g., high CPU, graphics, or Wi-Fi usage, etc.), the heat source 372 generates heat and the temperature of the electronic device 300 rises. The heat generated by the heat source 372 is conducted to the first heat spreader 402a, which in turn, conducts the heat to the matrixed heat spreader 406, the PCM 404, and the second heat spreader 402b. The temperature of the first heat spreader 402a, the second heat spreader 402b, the matrixed heat spreader 406, and the PCM 404 also rise as they absorb the heat energy generated by the heat source 372. By absorbing and spreading the heat energy, the first heat spreader 402a, the second heat spreader 402b, the matrixed heat spreader 406, and the PCM 404 dissipate the heat energy away from the heat source 372, thereby cooling the heat source 372.

Because the first heat spreader 402a, the second heat spreader 402b, and the matrixed heat spreader 406 are thermally coupled together, in one aspect, some of the initial heat may dissipate from the heat source 372 and out through the second heat spreader 402b (e.g., out through the back cover 370 of the electronic device 300). The first plurality of portions 406a and the second plurality of portions 406b (of the matrixed heat spreader 406) serve as additional surface area by which to transfer the heat to the PCM 404.

As the temperature of the PCM 404 rises, the PCM 404 may reach its melting point causing the PCM 404 to transition from solid to liquid. During the transition from solid to liquid, the PCM 404 absorbs additional heat energy away from the heat source 372 as the PCM 404 stores the heat energy as latent heat. By storing the heat energy as latent heat, the PCM 404 keeps the electronic device 300 from getting too hot and causing discomfort to the user of the electronic device 300.

When the electronic device 300 is powered OFF, enters a low power state, or enters a low CPU usage state, the temperature of the heat source 372 begins to fall. When the temperature of the PCM 404 reaches its freezing point, the PCM 404 transitions from liquid to a solid and the PCM 404 releases its latent heat energy. The heat released during this process is less likely to impact the heat source 372 since the electronic device 300 is under a low power/low usage state during this time. In one aspect, the PCM 404 makes direct physical contact with the first heat spreader 402a, the second heat spreader 402b, and the matrixed heat spreader 406 (including the first plurality of portions 406a and the second plurality of portions 406b) to maximize thermal conductivity between each of said components. Accordingly, as the PCM 404 releases its latent heat energy, the latent heat energy is substantially transferred to the matrixed heat spreader 406 including the first plurality of portions 406a and the second plurality of portions 406b. The matrixed heat spreader 406 transfers the released heat to the second heat spreader 402b, thereby allowing the heat to be released out of the electronic device 300 at an appropriate rate, so as not to cause discomfort to a user of the electronic device 300.

Figure 5A:
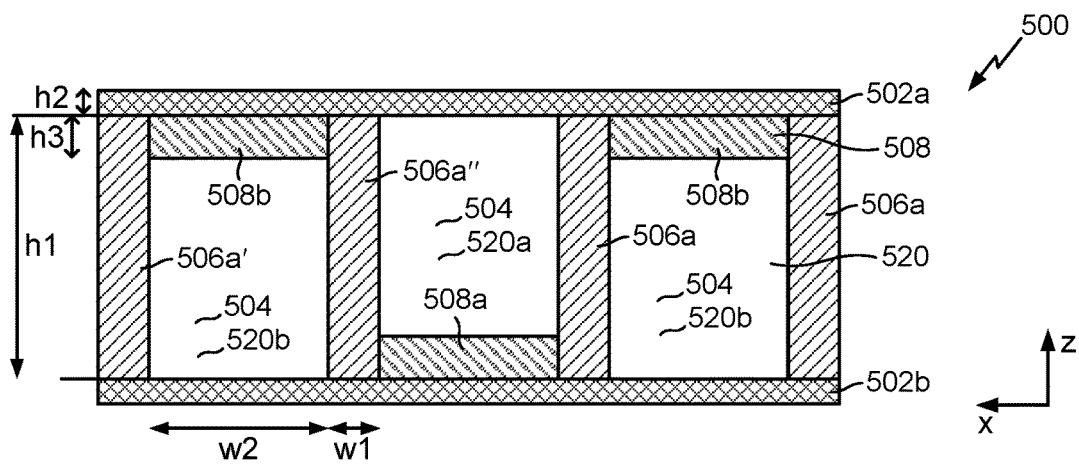
FIG. 5A illustrates a cross-section view of another apparatus for cooling an electronic device.

FIG. 5A illustrates a cross-section view of an apparatus 500 for cooling an electronic device. FIG. 5A is shown on the X-Z axis and is a cross section of FIG. 5B taken at A'. FIG. 5A is like FIG. 4A, except that FIG. 5A includes a third heat spreader 508. Specifically, FIG. 5A includes a first heat spreader 502a, a second heat spreader 502b, a matrixed heat spreader 506 including a first plurality of portions 506a and a second plurality of portions 506b (discussed in FIG. 5B), a phase change material (PCM) 504, and the third heat spreader 508. The apparatus 500 is configured to be coupled to a heat source such as the heat source 372 of FIG. 3. The apparatus 500 may be incorporated into an electronic device such as the exemplary electronic device 300 of FIG. 3.

The matrixed heat spreader 506 is physically coupled, directly or indirectly, and thermally coupled, either to an inner side of the first heat spreader 502a or to an inner side of the second heat spreader 502b. The third heat spreader 508 includes a third plurality of portions 508a physically coupled, either directly or indirectly, and thermally coupled to an inner side of the second heat spreader 502b and a fourth plurality of portions 508b physically coupled, either directly or indirectly, and thermally coupled to an inner side of the first heat spreader 502a. In one aspect, the third plurality of portions 508a and the fourth plurality of portions 508b are coupled to the second heat spreader 502b and the first heat spreader 502a respectively, in an alternating pattern. The third plurality of portions 508a of the third heat spreader 508 is physically coupled, either directly or indirectly, and thermally coupled to a lower portion of the sidewalls (i.e., inner sidewalls) of the matrixed heat spreader 506. The fourth plurality of portions 508b of the third heat spreader 508 is physically coupled, either directly or indirectly, and thermally coupled to an upper portion of the sidewalls (i.e., inner sidewalls) of the matrixed heat spreader 506. The third heat spreader 508 is formed in an alternating pattern such that it forms a serpentine shape when coupled with the matrixed heat spreader 506.

Figure 5B:
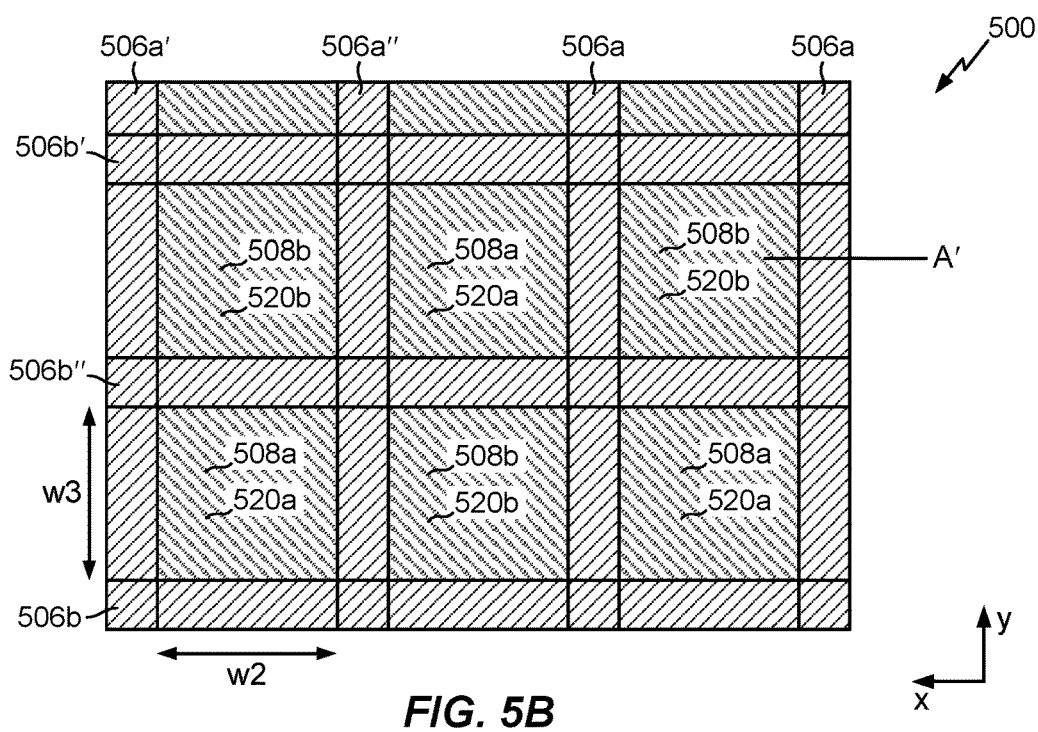
FIG. 5B illustrates a top-view of the apparatus of FIG. 5A.

FIG. 5B illustrates a top-view of the apparatus 500. FIG. 5B is shown on the X-Y axis, and for simplicity, does not show the first heat spreader 502a, the second heat spreader 502b, or the PCM 504. Specifically, FIG. 5B illustrates the matrixed heat spreader 506, including the first plurality of portions 506a, and the second plurality of portions 506b. The first plurality of portions 506a are perpendicular to the second plurality of portions 506b. The first plurality of portions 506a intersects the second plurality of portions 506b, so that together, they form a matrixed configuration (i.e., a matrixed heat spreader 506).

FIG. 5B further illustrates the third heat spreader 508 including the third plurality of portions 508a and the fourth plurality of portions 508b located in an alternating pattern within the matrixed heat spreader 506 (i.e., coupled to a portion of the inner side walls of the matrixed heat spreader 506).

The matrixed heat spreader 506 also defines a plurality of reservoirs 520 illustrated in both FIGS. 5A and 5B. The plurality of reservoirs 520 include a first one 520b and a second one 520a. The PCM 504 located in a first one 520b of the plurality of reservoirs 520 is enclosed by the fourth portion 508b and the second heat spreader 502b, and on the sides by the matrixed heat spreader 506. Wherein the matrixed heat spreader 506 includes a first one of a first plurality of portions 506a', a second one of the first plurality of portions 506a", a first one of a second plurality of portions 506b', and a second one of the second plurality of portions 506b".

Similarly, the PCM 504 located in a second one 520a of the plurality of reservoirs 520 is enclosed on the top and bottom respectively, by the first heat spreader 502a and the third portion 508a, and enclosed on the sides by the matrixed heat spreader 506 including the second one of the first plurality of portions 506a", and another one of the first plurality of portions 506a, the second one of the second plurality of portions 506b" and another one of the second plurality of portions 506b. This goes on in an alternating pattern. In other words, the PCM 504 is located in each one of the plurality of reservoirs 520, including the first one 520b and the second one 520a.

As illustrated in FIGS. 5A and 5B, the PCM 504 that is located in the first one 520b of the plurality of reservoirs 520, is thermally coupled to the second heat spreader 502b, and is thermally coupled to the first heat spreader through the plurality of fourth portions 508b of the third heat spreader 508. As mentioned previously, the PCM 504 is also thermally coupled to the inner sidewalls of the matrixed heat spreader 506. The PCM 504 that is located in the second one 520a of the plurality of reservoirs 520, is thermally coupled to the first heat spreader 502a, and is thermally coupled to the second heat spreader 502b through the third plurality of portions of the third heat spreader 508.

The width w1 of the first plurality of portions 506a and the width of the second plurality of portions 506b are similar to those discussed with respect to FIG. 3A. The width w2 of the third plurality of portions 508a and the fourth plurality of portions 508b is similar to the width w2 discussed with respect to FIG. 3A. Similarly, the height h1 of the first plurality of portions 506a and the second plurality of portions 506b is similar to the height h1 discussed with respect to FIG. 3A. The height h2 of the first heat spreader 502a or the second heat spreader 502b is like the height h2 of the first heat spreader 402a and the second heat spreader 402b of FIG. 4. The height h3 of the third plurality of portions 508a or fourth plurality of portions 508b is in the range of approximately 0.25-200 μm.

Figure 5C:
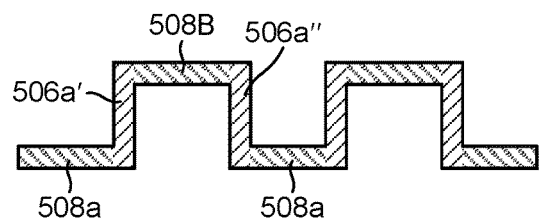
FIG. 5C illustrates a simplified side view of the apparatus of FIG. 5A.

FIG. 5C illustrates a simplified side view of apparatus 500. The third heat spreader 508 together with the matrixed heat spreader 506 form a serpentine shape as illustrated in FIG. 5C. Specifically, FIG. 5C illustrates the first one of the first plurality of portions 506a' coupled to one of the fourth plurality of portions 508b, the one of the fourth plurality of portions 508b is coupled to the second one of the first plurality of portions 506a", the second one of the first plurality of portions 506a" is coupled to one of the third plurality of portions 508a. Similarly, as shown in FIG. 5B, the first one of the second plurality of portions 506b' is coupled to one of the fourth plurality of portions 508b, the one of the fourth plurality of portions 508b is coupled to the second one of the second plurality of portions 506b", the second one of the second plurality of portions 506b" is coupled to one of the third plurality of portions 508a. In this way, the third heat spreader 508 forms a serpentine shape with the matrixed heat spreader 506.

Figure 1:
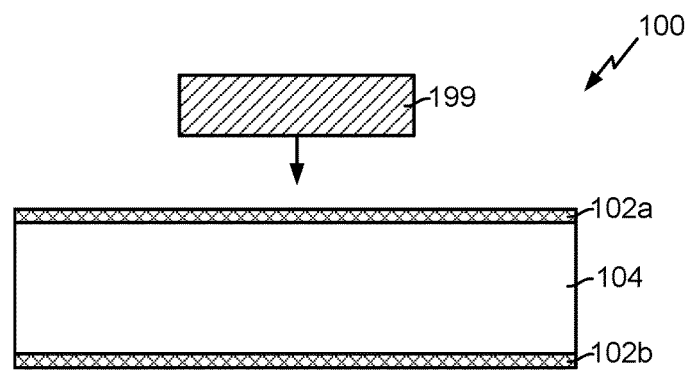
FIG. 1 illustrates a cross-section view of a conventional apparatus for cooling.
Figure 2A:
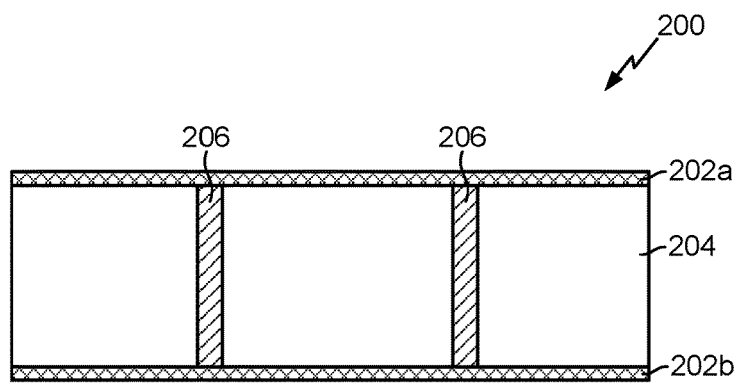
FIG. 2A illustrates a cross-section view of another conventional apparatus for cooling.
Figure 2B:
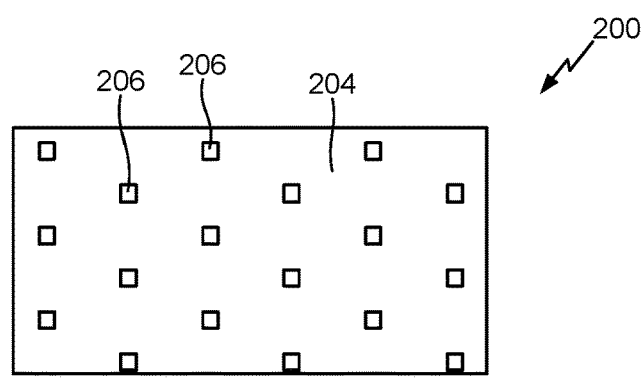
FIG. 2B illustrates a top view of the conventional apparatus of FIG. 2A

The PCM 504 works similarly to the PCM 404 described with respect to FIG. 4. Heat is absorbed when the PCM 504 changes from solid to liquid, and heat is released when the PCM 504 changes from liquid to solid. However, the third heat spreader 508 offers increased surface area and therefore increased heat spreading due to the serpentine shape. That is, the third heat spreader 508 quickly transfers heat from a heat source such as 372 of FIG. 3, to the PCM 504. Therefore, the user will experience better performance and less discomfort due to heat as compared with the apparatus 100 and 200 of FIGS. 1 and 2A-B respectively.

Figure 6A:
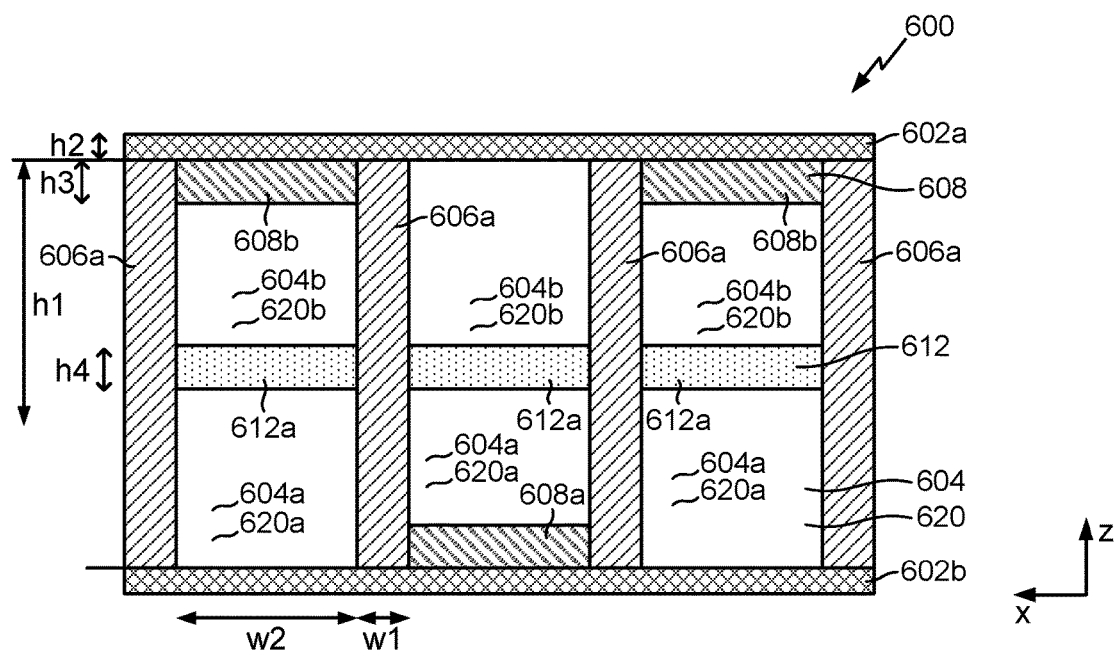
FIG. 6A illustrates a cross-section view of another apparatus for cooling a device.

FIG. 6A illustrates a cross-section view of an apparatus 600 for cooling a device. FIG. 6A is shown on the X-Z axis and is a cross section of FIG. 6B taken at A'. FIG. 6A is like FIG. 5A, except that FIG. 6A includes a fourth heat spreader 612. Specifically, FIG. 6A includes a first heat spreader 602a, a second heat spreader 602b, a matrixed heat spreader 606 including a first plurality of portions 606a and a second plurality of portions 606b (see FIG. 6B), a phase change material (PCM) 604, a third heat spreader 608, and the fourth heat spreader 612 including a fifth plurality of portions 612a. The apparatus 600 is configured to be coupled to a heat source such as the heat source 372 of FIG. 3. The apparatus 600 may be incorporated into an electronic device such as the exemplary electronic device 300 of FIG. 3.

Figure 6B:
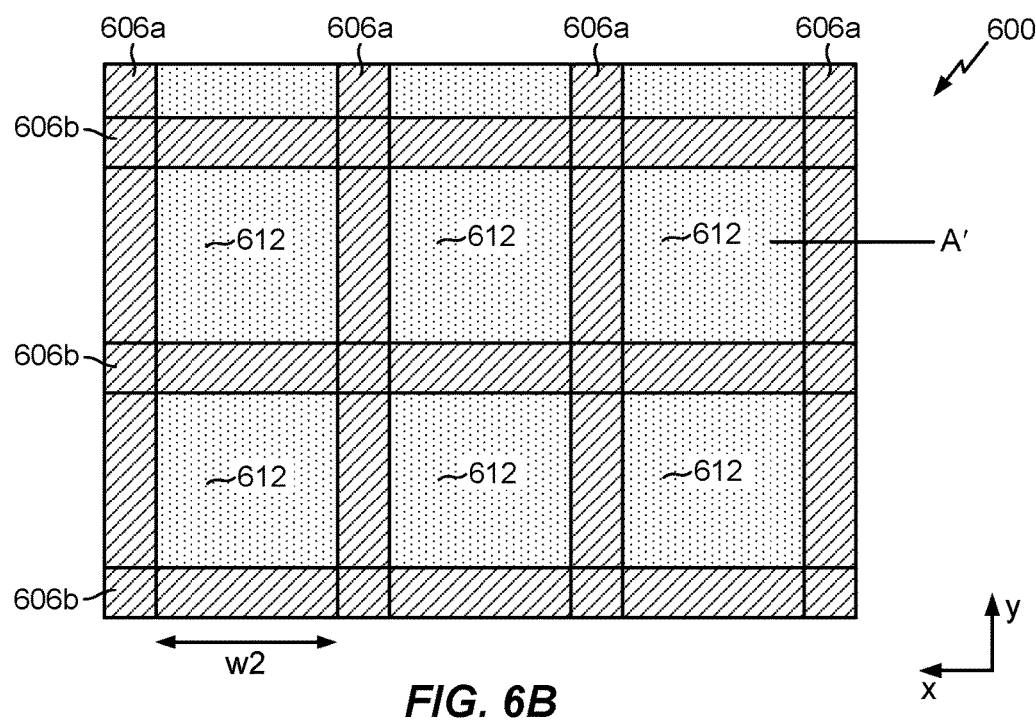
FIG. 6B illustrates a top-view of the apparatus of FIG. 6A.

FIG. 6B illustrates a top-view of the apparatus 600. FIG. 6B is shown on the X-Y axis, and for simplicity, does not show the first heat spreader 602a, the second heat spreader 602b, the third heat spreader 608, or the PCM 604. Specifically, FIG. 6B illustrates the matrixed heat spreader 606, including the first plurality of portions 606a, and the second plurality of portions 606b. The first plurality of portions 606a are perpendicular to the second plurality of portions 606b. The first plurality of portions 606a intersects the second plurality of portions 606b, so that together, they form a matrixed configuration (i.e., a matrixed heat spreader 606).

FIG. 6B further illustrates the fourth heat spreader 612 including the fifth plurality of portions 612a located between (e.g., inside) the first plurality of portions 606a and the second plurality of portions 606b of the matrixed heat spreader 606.

Returning to FIG. 6A, the matrixed heat spreader 606 is physically coupled, directly or indirectly, and thermally coupled, either to an inner side of the first heat spreader 602a or to an inner side of the second heat spreader 602b. The third heat spreader 608 includes a third plurality of portions 608a physically coupled, either directly or indirectly, and thermally coupled to an inner side of the second heat spreader 602b and a fourth plurality of portions 608b physically coupled, either directly or indirectly, and thermally coupled to an inner side of the first heat spreader 602a. In one aspect, the third plurality of portions 608a and the fourth plurality of portions 608b are coupled to the second heat spreader 602b and the first heat spreader 602a respec-tively, in an alternating pattern. The third heat spreader 608 is physically coupled, either directly or indirectly, and thermally coupled to a portion of the sidewalls (i.e., inner side walls) of the matrixed heat spreader 606. The third heat spreader 608 is formed in an alternating pattern such that it forms a serpentine shape when coupled with the matrixed heat spreader 606. The third heat spreader 608 may be located in the matrixed heat spreader 606.

The fourth heat spreader 612 including the fifth plurality of portions 612a is physically coupled, either directly or indirectly, and thermally coupled to a portion of the inner sidewalls of the matrixed heat spreader 606. That is, a first side and a second side of the fifth plurality of portions 612a are coupled to the inner sidewalls of the matrixed heat spreader. The fifth plurality of portions 612a are coupled to the PCM 604. Specifically, a third side and a fourth side of the fifth plurality of portions 612a are each coupled to the PCM 604.

The fifth plurality of portions 612a are parallel to the first heat spreader 602a and the second heat spreader 602b. In a first aspect, the fifth plurality of portions 612a are located midway (e.g., substantially halfway) between the first heat spreader 602a and the second heat spreader 602b. In a second aspect, the fifth plurality of portions 612a are located midway (e.g., substantially halfway) between the second heat spreader 602b and the fourth plurality of portions 608b (of the third heat spreader 608), or midway between the first heat spreader 602a and the third plurality of portions 608a.

In any of the above aspects, the fifth plurality of portions 612a are located anywhere between the first heat spreader 602a and the second heat spreader 602b, as long as the fifth plurality of portions 612a intersects the PCM 604 so that it separates the PCM 604 into two parts. That is, the fourth heat spreader 612 divides the PCM 604 into a first part 604a and a second part 604b, so that the third side and the fourth side of each of the fifth plurality of portions 612a are each coupled to the PCM 604a and 604b respectively. The fourth side of each of the fifth plurality of portions 612 is opposite the third side.

A plurality of reservoirs 620 are defined by the matrixed heat spreader 606. The plurality of reservoirs 620 include a first part 620a and a second part 620b. The first part 604a of the PCM 604 is located in the first part 620a of the plurality of reservoirs 620, and the second part 604b of the PCM is located in the second part 620b of the plurality of reservoirs 620. The PCM 604 is thermally coupled to the matrixed heat spreader 606, the first part 604a of the PCM 604 is thermally coupled to the second heat spreader 602b (either directly or indirectly), and the second part 604b of the PCM 604 is thermally coupled to the first heat spreader 602a (either directly or indirectly). Further, the first part 604a of the PCM 604 is thermally coupled to one side of the fifth plurality of portions 612a and the second part 604b of the PCM 604 is thermally coupled to another side of the fifth plurality of portions 612a.

The heights h1, h2, h3, and the widths w1, w2 are similar to the respective heights and widths described for apparatus 500 of FIGS. 5A and 5B. The height h4 of the fifth plurality of portions is in the range of approximately 25-200 microns.

The PCM 604 works similarly to the PCM 304 described with respect to FIG. 3. Heat is absorbed when the PCM 604 changes from solid to liquid, and heat is released when the PCM 604 changes from liquid to solid. However, the fourth heat spreader 612 offers increased surface area and therefore increased heat spreading. Therefore, the user will experience improved performance and less discomfort due to heat as compared with the apparatus 100 and 200 illustrated in FIGS. 1 and 2A-B.

Exemplary Sequence for an Apparatus for Cooling an Electronic Device, Including Phase Change Material and a Matrixed Heat Spreader In some implementations, manufacturing an apparatus for cooling an electronic device includes several sequences. FIG. 7 (which includes FIGS. 7A-7E), FIG. 8 (which includes FIGS. 8A-8E), and FIG. 9 (which includes FIGS. 9A-9E) illustrates an exemplary sequence for manufacturing an apparatus for cooling an electronic device. In some implementations, the sequence of FIG. 7 may be used to manufacture the apparatus of FIG. 4A-B. In some implantations, the sequence of FIG. 8 may be used to manufacture the apparatus of FIG. 5A-C. In some implementations, the sequence of FIG. 9 may be used to manufacture the apparatus of FIG. 6A-B.

Figure 7A:
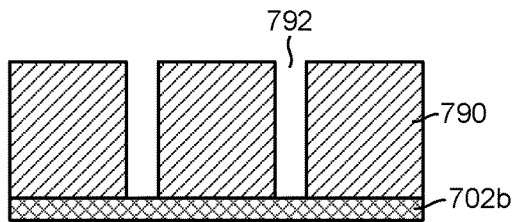

FIG. 7A-E illustrates the manufacture of an apparatus for cooling an electronic device. FIG. 7A illustrates a mold 790 on a second heat spreader 702b. The second heat spreader 702b may be graphite, copper, or any other material that is a thermal conductor. A plurality of trenches 792 are formed in the mold 790. The plurality of trenches 792 include a first set of trenches and a second set of trenches (e.g., see 406A and 406B of FIG. 4B where the matrixed heat spreader 406 is formed within the plurality of trenches), where the first set of trenches are perpendicular to the second set of trenches and intersect the second set of trenches.

Figure 7B:
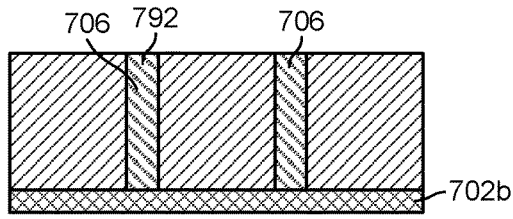

FIG. 7B illustrates the formation of the matrixed heat spreader 706. The matrixed heat spreader 706 is formed by depositing a thermally conductive material inside the plurality of trenches 792 (including the first set of trenches and the second set of trenches). The thermally conductive material may be copper or any other metal material, or an alloy of such materials. The matrixed heat spreader 706 include a plurality of first portions and a plurality of second portions (e.g., see 406A and 406B of FIG. 4B) perpendicular and intersecting each other.

Figure 7C:
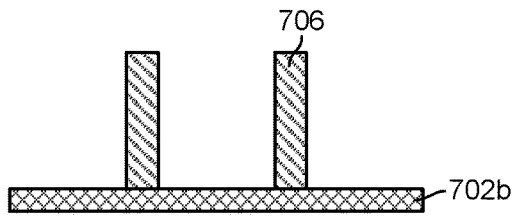

FIG. 7C illustrates the apparatus after removal of the mold 790, leaving the matrixed heat spreader 706 coupled to the second heat spreader 702b.

Figure 7D:
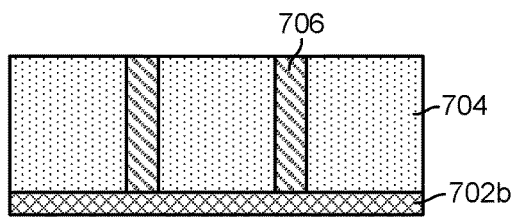

FIG. 7D illustrates a phase change material (PCM) 704 surrounding the matrixed heat spreader 706 and coupled to the second heat spreader 702b.

Figure 7E:
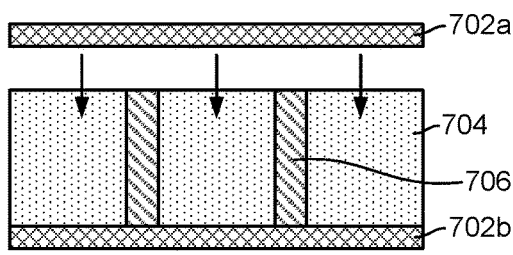

FIG. 7E illustrates a first heat spreader 702a coupled to the PCM 704 and coupled to the matrixed heat spreader 706.

Figure 8A:
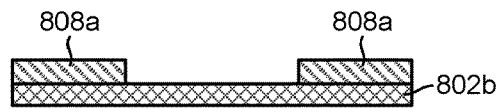

FIG. 8A-E illustrates the manufacture of an apparatus for cooling an electronic device. FIG. 8A illustrates a third plurality of portions 808a on a second heat spreader 802a. The third plurality of portions 808a may be deposited onto the second heat spreader 802b by any known deposition methods. The third plurality of portions 808a are spaced apart, i.e., with space between them, in an alternating pattern.

Figure 8B:
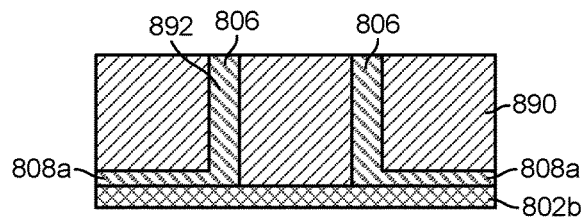

FIG. 8B illustrates the formation of a matrixed heat spreader 806. Specifically, a mold 890 is formed over the second heat spreader 802b and the third plurality of portions 808a. A plurality of trenches 892 are formed in the mold including a first set of trenches and a second set of trenches (e.g., see 506A and 506B of FIG. 5B where the matrixed heat spreader 506 is formed within the plurality of trenches) that are perpendicular and intersect with the first set of trenches 892. The plurality of trenches 892 are filled with the matrixed heat spreader 806. The matrixed heat spreader 806 includes a plurality of first portions and a plurality of second portions (for example, see 506A and 506B of FIG. 5B) perpendicular and intersecting each other.

Figure 8C:
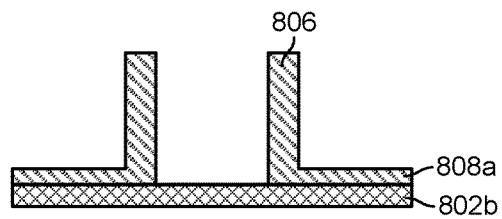

FIG. 8C illustrates FIG. 8B after the mold 890 has been removed, leaving the third plurality of portions 808a and the matrixed heat spreader 806 coupled to the second heat spreader 802b.

Figure 8D:
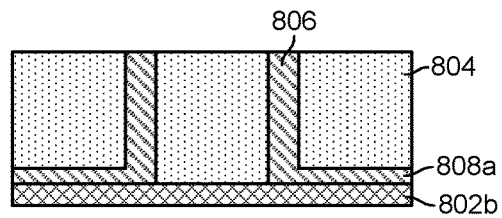

FIG. 8D illustrates a phase change material (PCM) 804 surrounding the matrixed heat spreader 806, the third plurality of portions 808a and coupled to the first second spreader 802b.

Figure 8E:
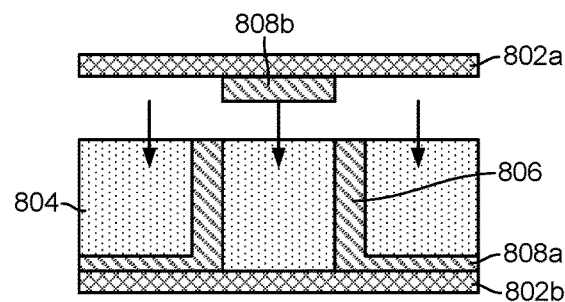

FIG. 8E illustrates a fourth plurality of portions 808b coupled to a first heat spreader 802a. The fourth plurality of portions 808b and the first heat spreader 802a may be made of the same or similar materials as the third plurality of portions 808a and the second heat spreader 802b, respectively. The fourth plurality of portions 808b and the first heat spreader 802a are coupled to the PCM 804. The fourth plurality of portions 808b are also coupled to the matrixed heat spreader 806. Together, the third plurality of portions 808a and the fourth plurality of portions 808b form a third heat spreader 808. The third heat spreader 808, together with the matrixed heat spreader 806, form a serpentine shape.

Figure 9A:
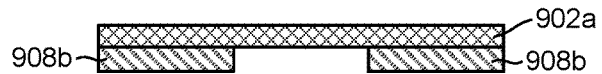
Figure 9A:
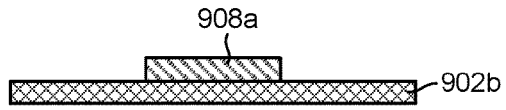

FIG. 9A-D illustrates the manufacture of an apparatus for cooling an electronic device. FIG. 9A illustrates a bottom part of the apparatus including a second heat spreader 902b coupled to a third plurality of portions 908a (that will later be shown is part of a third heat spreader). The third plurality of portions 908a may be deposited onto the second heat spreader 902b by known methods. FIG. 9A further illustrates a top part of the apparatus including a first heat spreader 902a coupled to a fourth plurality of portions 908b. The fourth plurality of portions 908b are deposited onto the first heat spreader 902a by known methods and are deposited so there is a gap between each one of the fourth plurality of portions 908b, allowing for the serpentine shape of the third heat spreader. The first heat spreader 902a and the second heat spreader 902b may be made of graphite, a metal, or a combination thereof, or any conductive material. The third plurality of portions 908a and the fourth plurality of portions 908b may be made of copper, a metal, or combination thereof, or any conductive material.

Figure 9B:
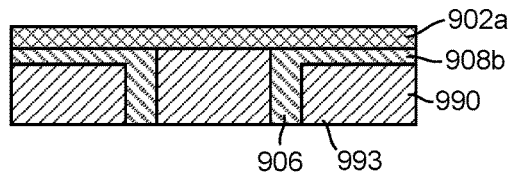
Figure 9B:
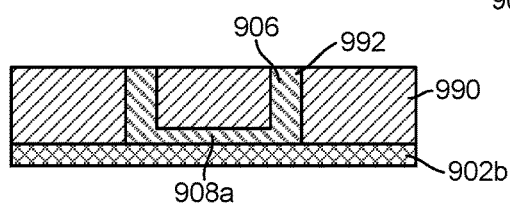

FIG. 9B illustrates the formation of a matrixed heat spreader 906. Regarding the bottom part of the apparatus, a mold 990 is formed over the second heat spreader 902b and the third plurality of portions 908a. A plurality of trenches 992 are formed in the mold 990 including a first set of trenches and a second set of trenches (e.g., see 606A and 606B of FIG. 6B where the matrixed heat spreader 606 is formed within the plurality of trenches) that are perpendicular and intersect with the first set of trenches 992. The plurality of trenches 992 are filled with the matrixed heat spreader 906. Similarly, for the top part of the apparatus, a mold 990 is formed over the first heat spreader 902a and the fourth plurality of portions 908b. A plurality of trenches 993 are formed in the mold 990 including a first set of trenches and a second set of trenches (e.g., see 606A and 606B of FIG. 6B where the matrixed heat spreader 606 is formed within the plurality of trenches) that are perpendicular and intersect with the first set of trenches. The plurality of trenches 993 are filled with the matrixed heat spreader 906. The matrixed heat spreader 906 include a plurality of first portions and a plurality of second portions (e.g., see 606A and 606B of FIG. 6B) perpendicular and intersecting each other.

Figure 9C:
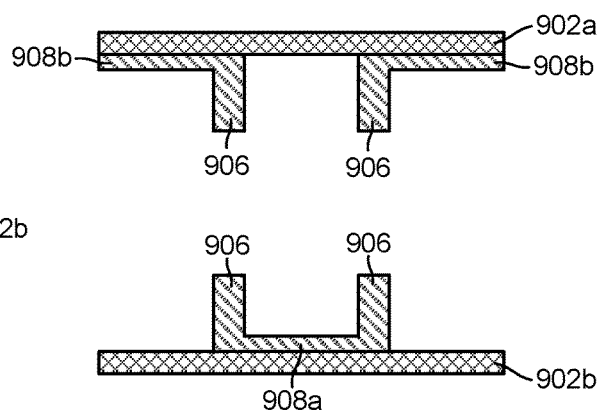

FIG. 9C illustrates FIG. 9B after the mold 990 has been removed. Regarding the bottom part of the apparatus, the mold 990 removal leaves the third plurality of portions 908a and the matrixed heat spreader 906 coupled to the second heat spreader 902b, and regarding the top part of the apparatus, the mold 990 removal leaves the fourth plurality of portions 908b and the matrixed heat spreader 906 coupled to the first heat spreader 902a.

Figure 9D:
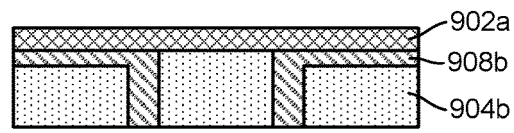
Figure 9D:
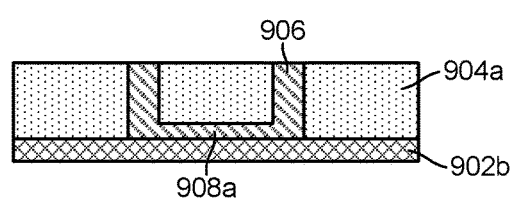

FIG. 9D illustrates a phase change material (PCM) 904 including bottom PCM 904a and top PCM 904b. Regarding the bottom part of the apparatus, a bottom PCM 904a surrounds the matrixed heat spreader 906, the third plurality of portions 908a, and the second heat spreader 902b. Regarding the top part of the apparatus, a top PCM 904b surrounds the matrixed heat spreader 906, the fourth plurality of portions 908b, and the first heat spreader 902a.

Figure 9E:
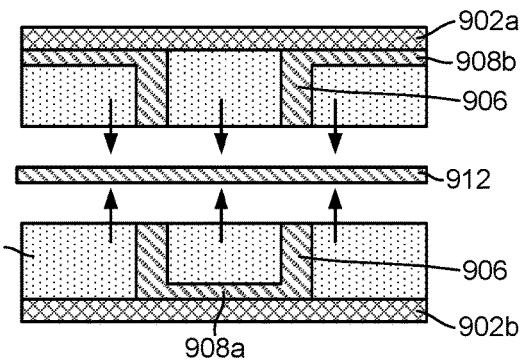

FIG. 9E illustrates a fourth heat spreader 912. The bottom part of the apparatus is coupled to a first side of the fourth heat spreader 912, and the top part of the apparatus is coupled to a second side of the fourth heat spreader 912. The fourth heat spreader 912 may be made of copper, graphite, metal or any other heat conducting material.

Exemplary Flow Diagram of a Method for Manufacturing Perpendicular Inductors Integrated in a Substrate FIG. 10 illustrates an exemplary flow diagram of a method for manufacturing an apparatus for cooling. It should be noted that for the purpose of clarity and simplification, the flow diagram of FIG. 10 does not necessarily include all the steps of manufacturing. Moreover, in some instances, several steps may have been combined into a single step to simplify the description of the sequences.

The method includes forming a first heat spreader and a second heat spreader at block 1001. Next, the method includes forming a first plurality of portions and a second plurality of portions of a matrixed heat spreader, the first plurality of portions perpendicular to, and intersecting the second plurality of portions at block 1002. The method further includes depositing a phase change material (PCM) to surround the matrixed heat spreader, the PCM located in a plurality of reservoirs defined by the matrixed heat spreader, at step 1003.

Exemplary Electronic Devices

FIG. 11 illustrates various electronic devices that may be integrated with any of the aforementioned integrated device, semiconductor device, integrated circuit, die, apparatus, or package. For example, a mobile phone device 1102, a laptop computer device 1104, a fixed location terminal device 1106, a wearable device 1108 may include an integrated device 1100 as described herein. The integrated device 1100 may be, for example, any of the substrate, integrated circuits, dies, integrated devices, integrated device packages, integrated circuit devices, device packages, integrated circuit (IC) packages, package-on-package devices described herein. The devices 1102, 1104, 1106, 1108 illustrated in FIG. 11 are merely exemplary. Other electronic devices may also feature the integrated device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 3, 4A-B, 5A-C, 6A-B, 7A-E, 8A-E, 9A-E, and/or 10 (i.e., FIGS. 3-10) may be rearranged and/or combined into a single component, process, feature or function or embodied in several components, processes, or functions. Additional elements, components, processes, and/or functions may also be added without departing from the disclosure. It should also be noted that FIGS. 3 through 9, and/or 10 and its corresponding description in the present disclosure is not so limited. In some implementations, FIGS. 3 through 9, and/or 10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus, comprising:
a first heat spreader and a second heat spreader;
a matrixed heat spreader, the matrixed heat spreader including a first plurality of portions perpendicular to a second plurality of portions, the first plurality of portions intersecting the second plurality of portions, wherein the matrixed heat spreader is thermally coupled to an inner side of the first heat spreader, the first heat spreader located over the matrixed heat spreader, and the matrixed heat spreader is thermally coupled to an inner side of the second heat spreader, the second heat spreader located under the matrixed heat spreader;
a third heat spreader including a third plurality of portions located on, and thermally coupled to the second heat spreader, and a fourth plurality of portions located on, and thermally coupled to the first heat spreader; and a phase change material (PCM) located in a plurality of reservoirs defined by the matrixed heat spreader.

2. The apparatus of claim 1, wherein the PCM is thermally coupled to, and enclosed, by each of the first heat spreader, the second heat spreader and the first plurality of portions and the second plurality of portions of the matrixed heat spreader.

3. The apparatus of claim 1, wherein the third plurality of portions is thermally coupled to a lower portion of sidewalls of the matrixed heat spreader, and the fourth plurality of portions is thermally coupled to an upper portion of sidewalls of the matrixed heat spreader in an alternating pattern.

4. The apparatus of claim 3, wherein the third heat spreader is coupled to the second heat spreader and the first heat spreader in an alternating pattern such that it forms a serpentine shape with the matrixed heat spreader.

5. The apparatus of claim 4, wherein the PCM is thermally coupled to the first heat spreader through the fourth plurality of portions, and wherein the PCM is thermally coupled to the second heat spreader through the third plurality of portions.

6. The apparatus of claim 4, further comprising:
a fourth heat spreader including a fifth plurality of portions located in the matrixed heat spreader.

7. The apparatus of claim 6, wherein the fifth plurality of portions are thermally coupled to another portion of the sidewalls of the matrixed heat spreader, wherein the another portion of the sidewalls is different than the upper portion and lower portion of the sidewalls of the matrixed heat spreader.

8. The apparatus of claim 7, wherein the fifth plurality of portions is located between the first heat spreader and the second heat spreader and divides the PCM into a first part and a second part.

9. The apparatus of claim 8, wherein the fifth plurality of portions has a first side thermally coupled to the first part of the PCM, and a second side opposite of the first side, that is thermally coupled to the second part of the PCM.

10. The apparatus of claim 9, wherein the first part of the PCM is located in a first part of the plurality of reservoirs, and wherein the second part of the PCM is located in a second part of the plurality of reservoirs.

11. The apparatus of claim 10, wherein the apparatus is incorporated into a device selected from a group consisting of a music player, a video player, an entertainment unit, a navigation device, a communications device, a mobile device, a mobile phone, a smart phone, a personal digital assistant, a fixed location terminal or server, a tablet computer, a wearable computing device, and a laptop computer.

12. The apparatus of claim 1, wherein the plurality of reservoirs are enclosed by the third plurality of portions and the first heat spreader, and the fourth plurality of portions and the second heat spreader in an alternating pattern.

13. The apparatus of claim 12, wherein the third plurality of portions and the fourth plurality of portions of the third heat spreader are located in an alternating pattern within the matrixed heat spreader.

14. The apparatus of claim 13, wherein together, the matrixed heat spreader and the third plurality of portions and the fourth plurality of portions form a serpentine shape.

15. The apparatus according to claim 1 or 6, wherein the apparatus is configured to be coupled to a heat source selected from the group consisting of an integrated circuit, a package, a circuit, or any combination thereof.

16. A method for fabricating an apparatus for cooling an electronic device, comprising:
forming a first heat spreader and a second heat spreader;
forming a first plurality of portions and a second plurality of portions of a matrixed heat spreader, the first plurality of portions perpendicular to, and intersecting the second plurality of portions;
coupling the matrixed heat spreader to an inner side of the first heat spreader, the first heat spreader located over the matrixed heat spreader and coupling the matrixed heat spreader to an inner side of the second heat spreader, the second heat spreader located under the matrixed heat spreader;
forming a third heat spreader including forming a third plurality of portions located on, and thermally coupled to the second heat spreader, and forming a fourth plurality of portions located on, and thermally coupled to the first heat spreader; and
depositing a phase change material (PCM) to surround the matrixed heat spreader, the PCM located in a plurality of reservoirs defined by the matrixed heat spreader.

17. The method of claim 16, wherein the PCM is thermally coupled to, and enclosed, by each of the first heat spreader, the second heat spreader and the first plurality of portions and the second plurality of portions of the matrixed heat spreader.

18. The method of claim 16, including thermally coupling the third plurality of portions to a lower portion of sidewalls of the matrixed heat spreader, and the fourth plurality of portions is thermally coupled to an upper portion of sidewalls of the matrixed heat spreader 506 in an alternating pattern.

19. The method of claim 18, including thermally coupling the PCM to the first heat spreader through the fourth plurality of portions, and thermally coupling the PCM to the second heat spreader through the third plurality of portions.

20. The method of claim 19, including forming a fourth heat spreader that further includes a fifth plurality of portions located in the matrixed heat spreader.

21. The method of claim 20, including thermally coupling the fifth plurality of portions to another portion of sidewalls of the matrixed heat spreader, wherein the another portion of sidewalls is different than the upper portion and lower portion of the sidewalls.

22. The method of claim 21, wherein the fifth plurality of portions is located between the first heat spreader and the second heat spreader and divides the PCM into a first part and a second part.

* * * * *